United States Patent [19]

Teigen et al.

[11] Patent Number: 4,791,524

[45] Date of Patent: Dec. 13, 1988

[54] ELECTROSTATIC DISCHARGE PROTECTION FOR ELECTRONIC PACKAGES

[75] Inventors: Scott C. Teigen, Rochester; Joel P. Weidendorf, West Concord, both of Minn.

[73] Assignee: International Business Machines Corporation, Armonk, N.Y.

[21] Appl. No.: 121,990

[22] Filed: Nov. 18, 1987

[51] Int. Cl.⁴ ............................................. H05F 3/02
[52] U.S. Cl. .................................. 361/212; 361/399; 361/415; 361/427; 361/429
[58] Field of Search .................. 338/60; 361/212, 220, 361/394, 395, 399, 413, 415, 424, 427, 429; 439/88, 92, 108

[56] References Cited

U.S. PATENT DOCUMENTS 4,439,809  3/1984  Weight et al. ...................... 361/220
4,574,332  3/1986  Calabro ............................. 361/413

Primary Examiner—A. D. Pellinen
Assistant Examiner—Gregory D. Thompson
Attorney, Agent, or Firm—J. Michael Anglin

[57] ABSTRACT

A circuit card has a conductive bracket (or frame or cover) which contacts the conductive frame (or cage or enclosure) of an assembly before the circuit can electrically connect to a bus or other circuit in the assembly. A high-value resistor between circuit ground and the bracket allows static charge to dissipate to frame ground harmlessly.

1 Claim, 6 Drawing Sheets

ELECTROSTATIC DISCHARGE PROTECTION FOR ELECTRONIC PACKAGES

BACKGROUND OF THE INVENTION

The present invention relates to the protection of electronic circuits from damage by electrostatic discharges when a circuit card or module is plugged into a larger assembly.

Electrostatic discharges cause increasing fatalities among electronic circuits, especially as the line spacing of integrated circuits becomes smaller and smaller, and as user-installed plug-in circuit cards become more common in equipment such as personal and even mid-range computers. Conductive plastic bags protect the cards during transportation, but the potential difference between a card and the assembly it plugs into might be thousands of volts at the instant of insertion. For a long time, the standard approach to solving this problem has been to provide the card socket with one pin, or the card with a conductive guide or stiffener, which contacts the conductive assembly frame first, and thus discharges the triboelectric charge on the card frame or on the user's hand as it contacts the frame. An improved approach connects the card member directly to a ground line in the circuit residing on the card, so that the circuit itself is tied to the potential of the frame. These solutions, however, still allow high-voltage discharges or sparks from the card to the assembly at some point. Other approaches, such as shorting fingers which move away from socket contacts when a card is inserted, or intricate networks of very small gaps, or resistors and diodes in signal leads, are expensive to implement and not always completely effective.

SUMMARY OF THE INVENTION

The present invention provides effective and inexpensive protection of the circuits on a card or other carrier from electrostatic discharges when its connector is attached to a mating connector on an electronic assembly having a conductive frame. A ground line of the card's circuits is connected by a high-value resistance to a card frame which is configured so as to contact the assembly frame before the connectors make contact. This bleeds off the static charge gradually rather than suddenly.

THE DRAWING

DESCRIPTION OF THE PREFERRED EMBODIMENT

Figure 1:
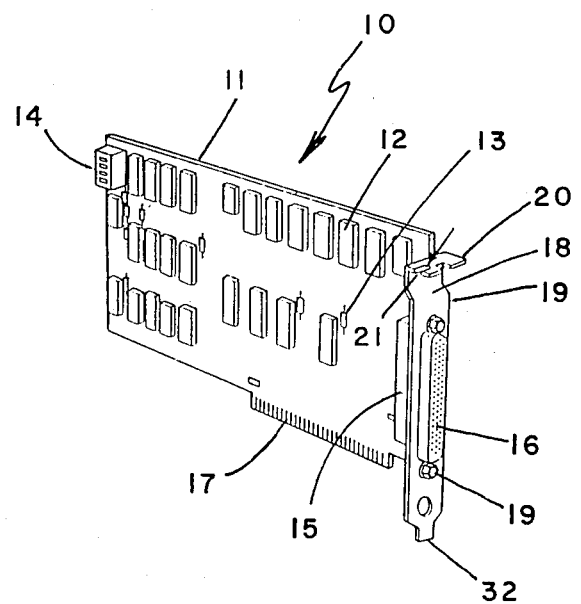
FIG. 1 shows a circuit card for a first embodiment of the invention.

FIG. 1 depicts an add-in circuit card 10 for a personal computer such as the IBM 5150, 5160, or 5170 models. A conventional printed-circuit board 11 is an insulating carrier for holding a number of electronic components such as integrated circuits 12, discrete components 13, switches, and a connector 15 for connecting the circuit on the card to external components by means of pins 16. The card 10 connects to a conventional backplane bus by means of edge contacts 17. Tail bracket or frame 18 is mounted to board 11 by mounting screws 23 on connector 15. Bracket 18 has an arm 20 with a screw slot 21, and also has a tang 22 at its lower end. Board 11 need not have an external connector; in that case, bracket 18 could be mounted directly to board 11 by short metal arms (not shown) projecting from the bracket.

Figure 2:
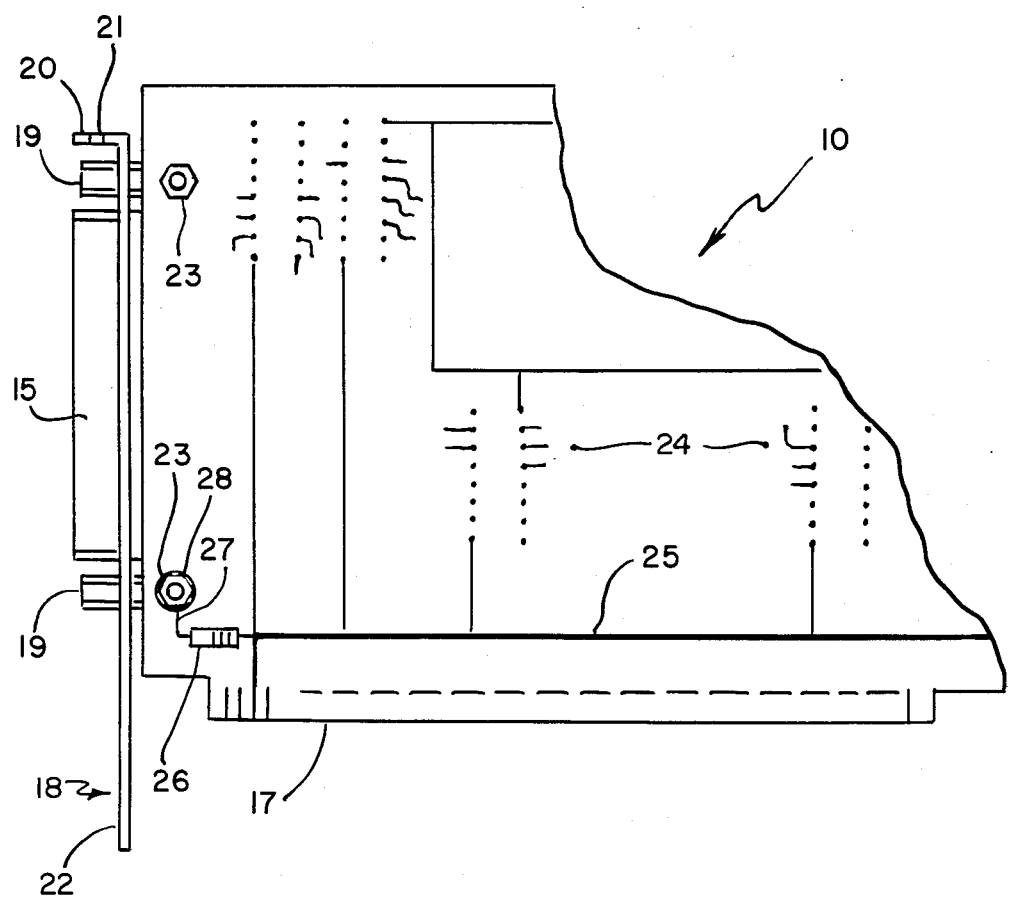
FIG. 2 is a partial view on an expanded scale of the card of FIG. 1.

FIG. 2 shows a small portion of the other side of card 10 to an enlarged scale. Connector 15 is mounted to board 11 by screws 23, which are electrically coupled to connector 15, screws 19, and thence to bracket 19. (If board 11 had no external connector, screws 23 would be connected directly to the bracket arms mentioned above.) Wiring patterns connect together the components 12-14 to form an electrical circuit 24—in this case, a digital circuit. One element of every circuit 24 is a ground conductor 25, only a small portion of which is shown in FIG. 2. In fact, the ground conductor may be so extensive as to form a ground plane, either covering all areas of one side of board 11 not carrying other wiring, or extending across nearly all of one side of the board, or occupying an entire internal layer of a multi-layer board. This ground may be referred to as a "logic ground" or a "signal ground" or a "circuit ground," since it carries the potential to which other voltages in the circuit are referred, usually including electrical power for the circuit. The other ground potential in a system is usually called the "frame ground" or "safety ground." Circuit ground is connected to one of the edge-card contacts 17, and thence to the backplane of the system.

A resistor 26 couples the circuit ground 25 to frame 18 via a short conductive trace 27 having a pad 28 under screw 23, then via the conductive shell of connector 15, and screws 19. (For cards without connectors 15, the previously mentioned bracket arms would couple directly to tail bracket 18 via screws 23.) The value of resistor 26 is chosen to have a time constant on the order of 0.05 to 0.5 second with the distributed capacitance of circuit 24. The distributed capacitance of the card is the free-field capacitance between a conductive object the size of the card and the infinite ground plane of the earth. Since the distributed capacitance of such a card is typically on the order of 100 picofarads, the value of the resistor should be on the order of 10 megohms to achieve the desired time constant. The tolerance on the time constant is quite wide.

Figure 3:
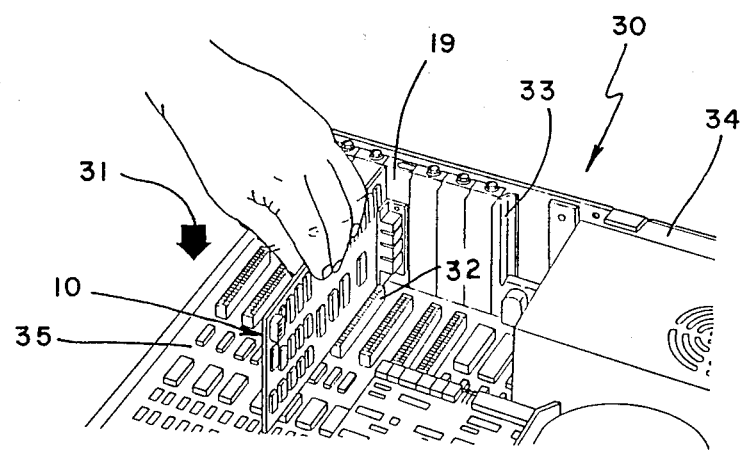
FIG. 3 is a partial view of an electronics assembly for receiving the circuit card of FIG. 1.

FIG. 3 shows card 10 being placed into an electronics assembly 30 such as a personal computer. As card 10 is lowered in the direction of arrow 31 so that edge contacts 17 will slide into socket 32 on backplate 35, tail bracket 18 will first contact conductive mounting plate 33. This plate, like bracket 18, is left unpainted, so that mechanical contact assures electrical contact as well. Plate 33 in turn is in mechanical and electrical contact with the overall equipment frame 34. Because of static electricity built up on frame 34 or on card 10, their potentials can be thousands, or even tens of thousands, of volts different before card 10 is plugged into socket 32. The discharge of this potential through contacts 17 to the backplane bus on system board 35 could easily damage components on the board or on the card by arcing through the thin insulating layer in the integrated circuits. But, as tail bracket 18 contacts mounting plate 33, the potential difference between card and system frame is equalized in a matter of one or a few tenths of a second—slowly enough that arcs and dangerous discharges are prevented, yet quickly enough that the potential difference is small when the edge connectors make contact with the bus socket.

Figure 4:
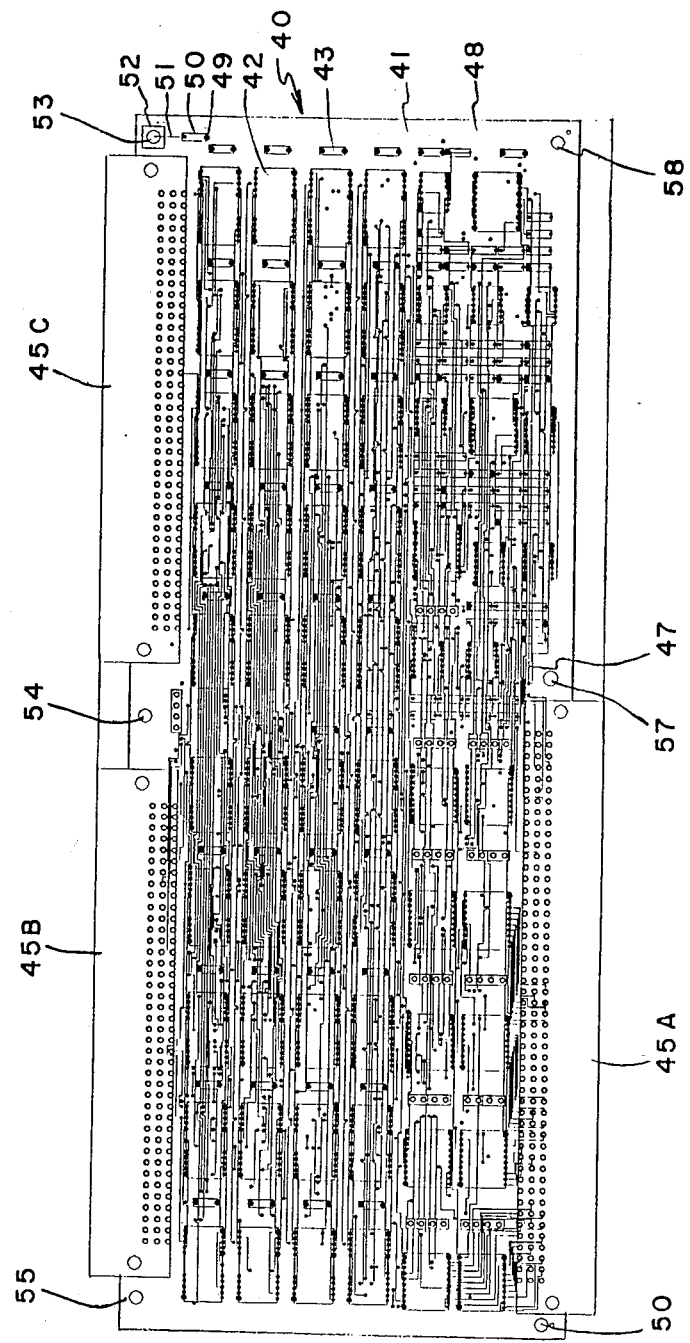
FIG. 4 shows a circuit card for a second embodiment of the invention.

FIG. 4 is a card 40 for a larger data processor, which uses covered "logic books" in a card cage or similar enclosure. Multi-layer printed-circuit board 41 provides an insulating carrier for integrated circuits 42, discrete components 43, and connectors 44–46. Wiring pattern 47 and ground plane 48 form a circuit on the card 40. Ground plane 48 forms an internal conductive plane or layer which covers almost all of the area of the card, except about 2 mm at the edges, as shown at the broken-away portion at one corner of card 40. A connection 49 couples one end of a 9 megohm resistor 50 to the circuit-ground potential of ground plane 48. Trace 51 couples its other end to pad 52, surrounding a mounting hole 53. Other mounting holes 54–58 are electrically insulated from the ground plane 48.

Figure 5:
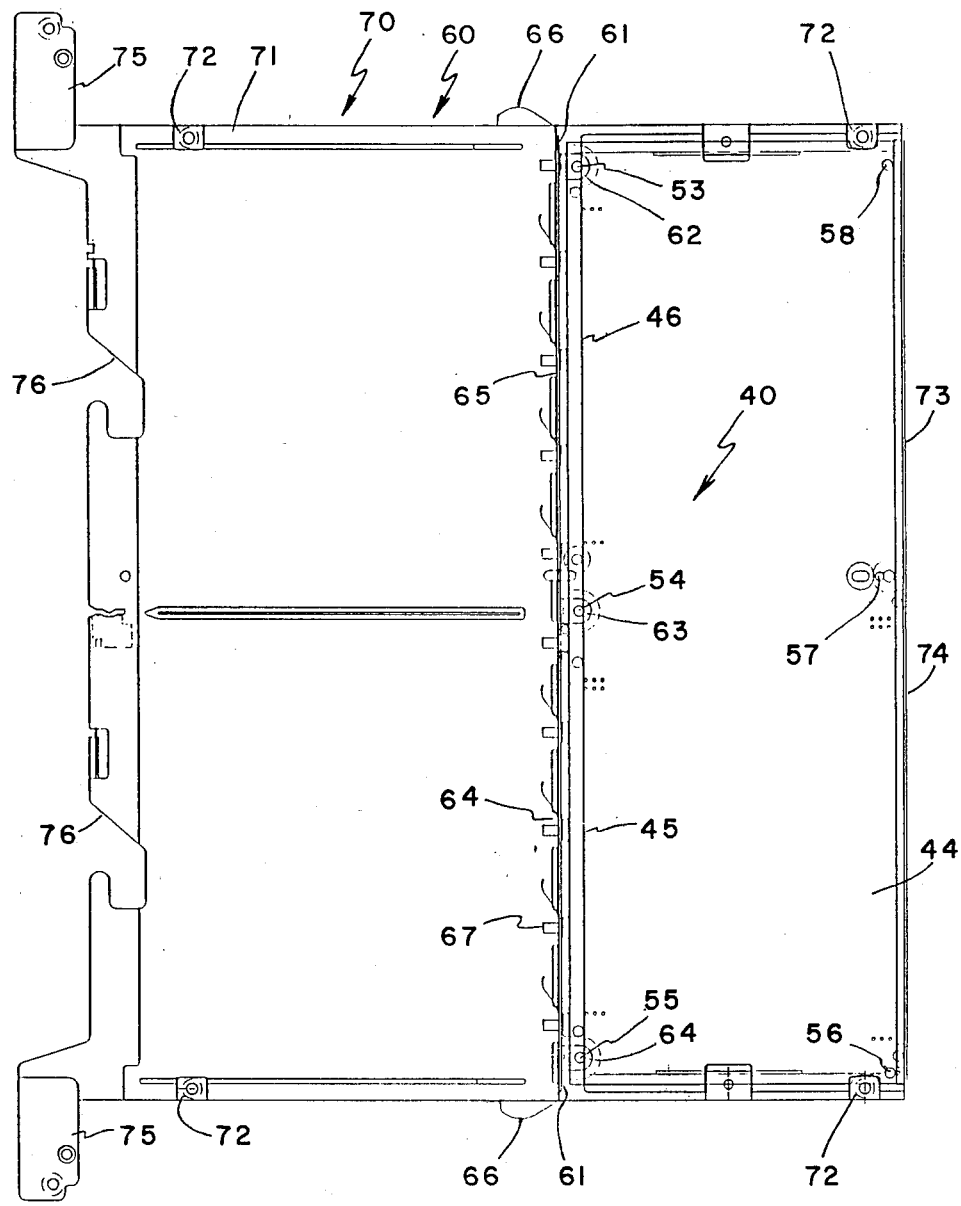
FIG. 5 shows a logic book for the card of FIG. 4.

FIG. 5 is a side view of a card 40 mounted in a conductive covered book 60. Conductive card bracket 61 carries ears 62–64 matching the locations of holes 53–55 for mounting card 40 to bracke 61 by screws or rivets (not shown). Bracket 61 has openings 64–65 for sockets 45–46 on card 40. Bracket 61 also has two conductive springs 66 welded thereto. Spring fingers 67 extend rearwardly from bracket 61 on both sides.

Book frame 70 comprises a conductive cover half 71 having ears 72 for mounting another conductive cover half (not shown), so that the book 70 is completely enclosed by a conductive casing. Front wall 73 has an opening 74 for socket 45 on card 40. Fastening the two cover halves together compresses springs 67 and traps bracket 61—and thus card 40 —into position. The rear of book 70 is open, and contains fixtures 75 for means (not shown) for securing the book to a card cage. The rear of the cover also has means 76 for securing daughter books (not shown) which plug into sockets 45–46.

Figure 6:
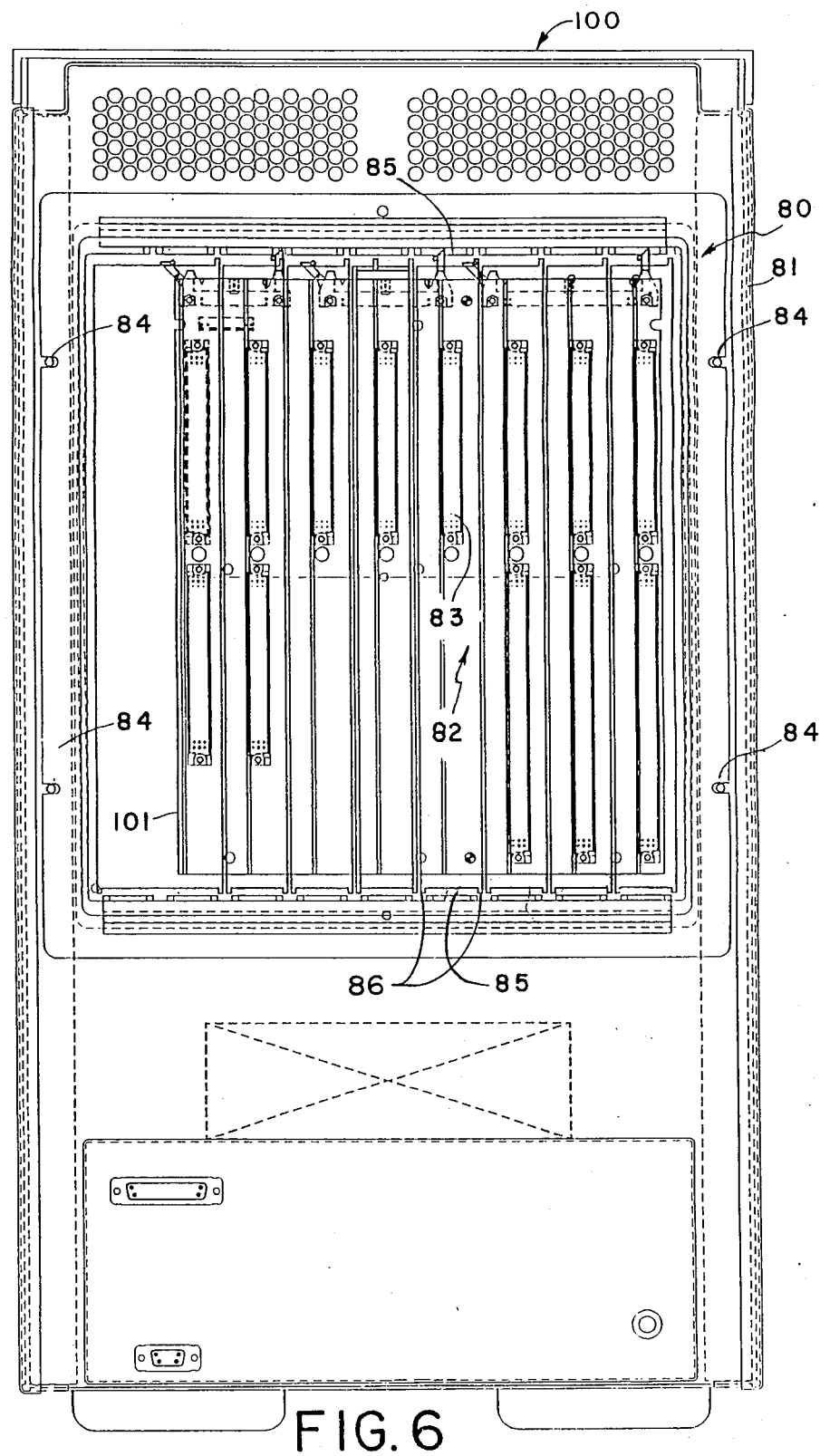
FIG. 6 illustrates a data-processor card cage for receiving the logic book of FIG. 5.

FIG. 6 is a top view of a card cage or frame 80 in a system 100 for holding a number of books such as 70, FIG. 5. Upstanding conductive frame 81 has a number of positions such as 82, defined by slots such as 86. Sockets such as 83 receive the book connector 45, and are in turn electrically coupled to a backplane bus 101 running to the other book sockets in cage 80. Cage 81 is mechanically and electrically connected to the system frame 100 at locations 84. End walls 85 form the top and bottom of cage 81. They are preferably of cast aluminum, formed with the slots 86 to guide books 70 into place.

When a covered book 70, FIG. 5, is lowered into cage 81 (i.e., into the plane of FIG. 6), conductive springs 66 make contact with end walls 85 long before connector 45 makes contact with backplane socket 83. Thus, the static potential difference between system 100 and card 40 is drained off in one or a few tenths of a second, long before the connector and socket contact each other. Again, because the discharge is gradual rather than rapid, no arc or damaging electrical transient can destroy the sensitive components in the circuit on board 41.

We claim:

1. An electronics package, comprising:
   an electronics assembly having a first electrical connector and having an electrically conductive frame;
   an insulating carrier;
   an electronic circuit mounted on said carrier, said circuit having a point of common potential;
   a second electrical connector mounted to said carrier, connected to said circuit, and adapted to mate with said first connector;
   a conductive frame physically attached to said carrier and configured so as to make electrical contact with said conductive frame of said assembly before said second connector makes contact with said first connector, when said carrier is inserted in said assembly;
   a high-value resistor electrically coupled between said point of common potential and said frame of said carrier, said resistor being chosen so as to discharge a static potential in said circuit in a time interval on the order of one second.

* * * * *